US010082960B1

(12) United States Patent
Chen

(10) Patent No.: US 10,082,960 B1
(45) Date of Patent: Sep. 25, 2018

(54) MEMORY DEVICE

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/465,751

(22) Filed: Mar. 22, 2017

(51) Int. Cl.
*G06F 3/06* (2006.01)
*G06F 11/16* (2006.01)
*G06F 11/20* (2006.01)

(52) U.S. Cl.
CPC ............ *G06F 3/0608* (2013.01); *G06F 3/064* (2013.01); *G06F 3/0679* (2013.01); *G06F 11/1625* (2013.01); *G06F 11/201* (2013.01); *G06F 11/2094* (2013.01)

(58) Field of Classification Search
CPC .. G06F 3/0608; G06F 11/2094; G06F 11/201; G06F 3/0679; G06F 3/064; G06F 11/1625
See application file for complete search history.

(56) References Cited

U.S. PATENT DOCUMENTS

| 2003/0174561 A1* | 9/2003 | Kamei ..................... G11C 7/14 365/200 |
| 2010/0107004 A1 | 4/2010 | Bottelli et al. |
| 2013/0117602 A1 | 5/2013 | Kim et al. |
| 2013/0332674 A1 | 12/2013 | Tanzawa |
| 2014/0103959 A1 | 4/2014 | Adreev et al. |
| 2014/0198593 A1 | 7/2014 | Kwon et al. |
| 2015/0294741 A1* | 10/2015 | Zhang .................... G11C 29/82 365/185.12 |
| 2016/0078964 A1 | 3/2016 | Kwon |

FOREIGN PATENT DOCUMENTS

TW          201403613 A       1/2014

OTHER PUBLICATIONS

Young Choi: "Next NAND flash point: performance"; EE Times; Connecting the Global Electronics Community; Copyright 2014 UBM Electronics, A AspenCore company; pp. 1-3.
TIPO Office Action dated Apr. 25, 2018 in Taiwan application (No. 106109101).

* cited by examiner

Primary Examiner — Mohammed A Bashar
(74) Attorney, Agent, or Firm — McClure, Qualey & Rodack, LLP

(57) ABSTRACT

A memory device is disclosed. The memory device includes a memory array. The memory array includes a main memory block and an extra memory block. The memory array includes a main bit line and an extra bit line. A ratio of a quantity of the extra memory block to a quantity of the main memory block is a block quantity ratio A. A ratio of a quantity of the extra bit line to a quantity of the main bit line is a bit line quantity ratio B. The block quantity ratio A is larger than the bit line quantity ratio B.

20 Claims, 9 Drawing Sheets

MEMORY DEVICE

BACKGROUND

Technical Field

The disclosure relates to a memory device, and particularly to a memory device having a NAND memory structure.

Description of the Related Art

As critical dimensions of devices in integrated circuits shrink toward perceived limits of manufacturing technologies, designers have been looking to techniques to achieve greater storage capacity, and to achieve lower costs per bit. Technologies being pursued include a NAND memory and an operation performed therefor.

SUMMARY

The present disclosure relates to a memory device.

According to an embodiment, a memory device is disclosed. The memory device comprises a memory array. The memory array comprises a main memory block and an extra memory block. The memory array comprises a main bit line and an extra bit line. A ratio of a quantity of the extra memory block to a quantity of the main memory block is a block quantity ratio A. A ratio of a quantity of the extra bit line to a quantity of the main bit line is a bit line quantity ratio B. The block quantity ratio A is larger than the bit line quantity ratio B.

The above and other embodiments of the disclosure will become better understood with regard to the following detailed description of the non-limiting embodiment(s). The following description is made with reference to the accompanying drawings.

DETAILED DESCRIPTION

In embodiments, a memory device is disclosed. The memory device has an extra bit line and an extra memory block or further a sub extra memory block capable of repairing for a main element so as to maintain an expected memory capacity for the memory device and increase product yield and product efficiency.

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

FIG. 1 to FIG. 4 are shown to disclose a concept relating to a block ratio and a bit line ratio according to embodiments.

Figure 1:
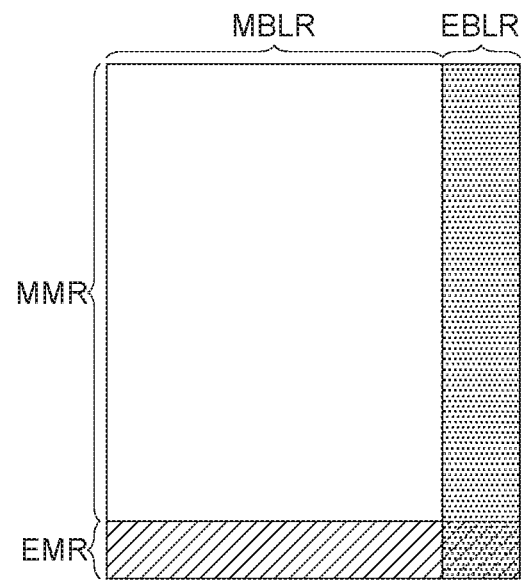
FIG. 1 is a schematic diagram illustrating a memory device according to an embodiment.

FIG. 1 is a schematic diagram illustrating a memory device according to an embodiment. The memory device comprises a memory array. The memory array comprises a memory array region MMR and a memory array region EMR. In an embodiment, the memory array region MMR and the memory array region EMR may be arranged along an extending direction of a NAND string. Each of the memory array region MMR and the memory array region EMR may comprise a (main) bit line region MBLR and an (extra) bit line region EBLR arranged along an extending direction of a word line WL.

Figure 2:
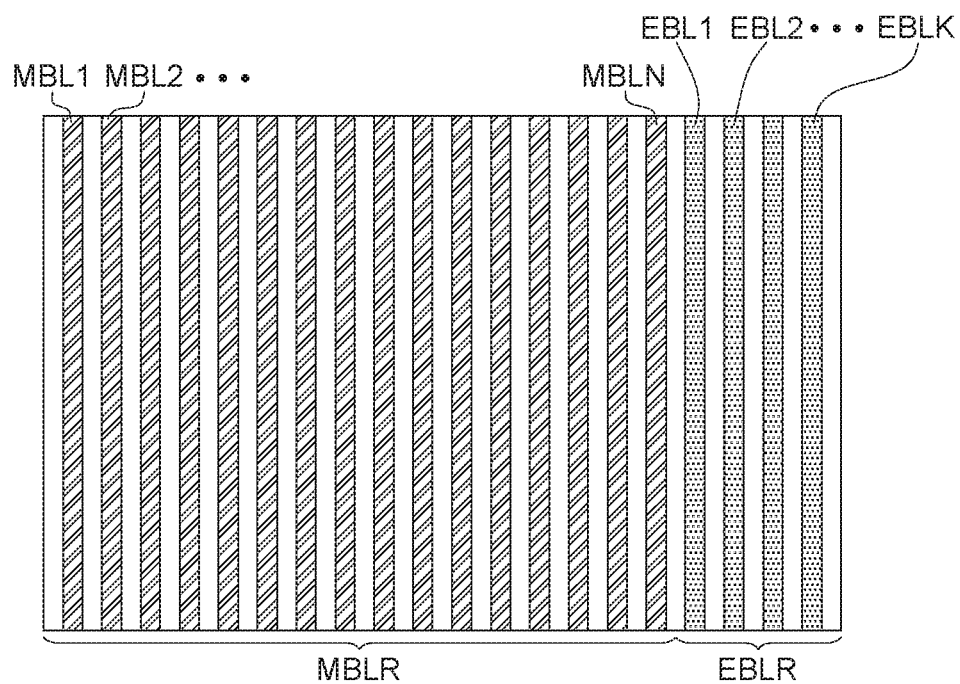
FIG. 2 illustrates a top view of the memory device showing the bit line region MBLR and the bit line region EBLR according to an embodiment.

FIG. 2 illustrates a top view of the memory device showing the bit line region MBLR and the bit line region EBLR according to an embodiment. In an embodiment, the bit line region MBLR is a main bit line region comprising main bit lines MBL. For example, the main bit lines MBL comprise main bit lines MBL1, MBL2 to MBLN (N is a positive integer) arranged in sequence as shown in FIG. 2. In an embodiment, the bit line region EBLR is an extra bit line region comprising extra bit lines EBL. For example, the extra bit lines EBL comprise extra bit lines EBL1, ELB2 to EBLK (K is a positive integer) arranged in sequence as shown in FIG. 2. The main bit lines MBL1, MBL2 to MBLN in the bit line region MBLR and the extra bit lines EBL1, ELB2 to EBLK in the bit line region EBLR are controlled independently.

Figure 3:
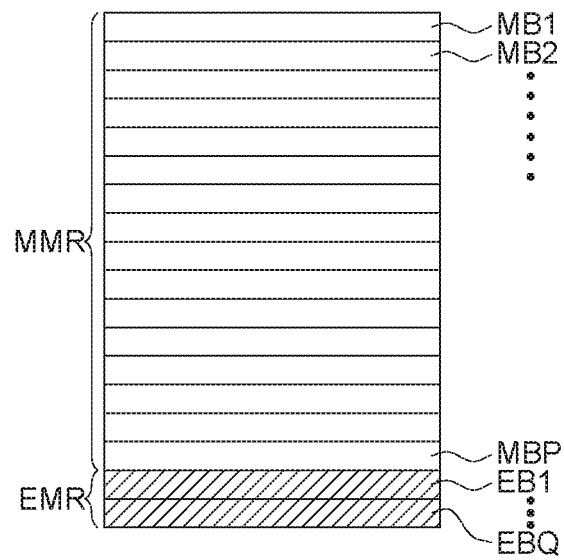
FIG. 3 is a schematic diagram for illustrating the memory array region MMR and the memory array region EMR according to an embodiment.

FIG. 3 is a schematic diagram for illustrating the memory array region MMR and the memory array region EMR according to an embodiment. In an embodiment, the memory array region MMR is a main memory array region comprising one or more main memory blocks MB. For example, the main memory blocks MB may comprise main memory blocks MB1, MB2 to MBP (P is a positive integer) arranged along an extending direction of a NAND string as shown in FIG. 3. In an embodiment, the memory array region EMR is an extra memory array region comprising one or more extra memory blocks EB. For example, the extra memory blocks EB may comprise extra memory blocks EB1 to EBQ (Q is a positive integer) arranged along an extending direction of a NAND string as shown in FIG. 3.

Figure 4:
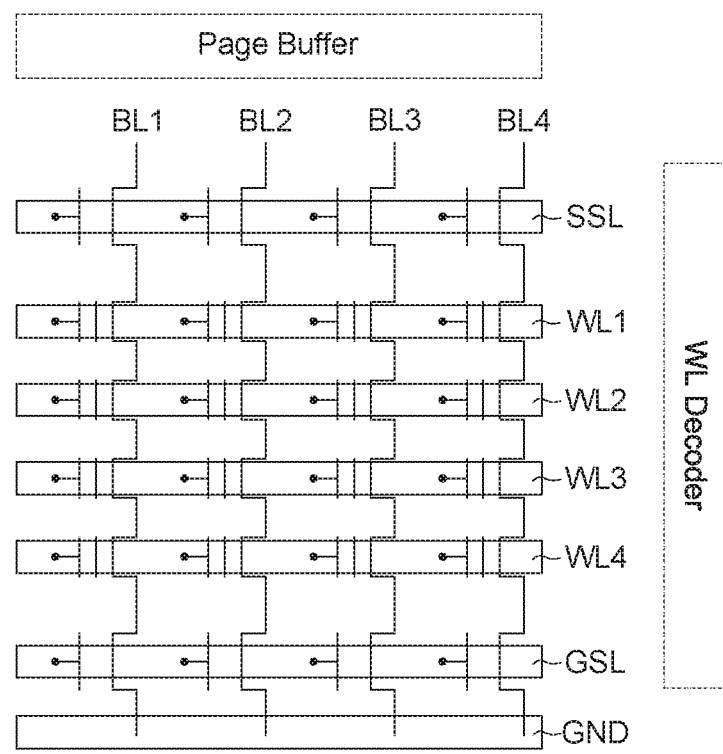
FIG. 4 is a schematic diagram illustrating an equivalent circuit of a memory block of a 2D NAND memory array according to an embodiment.

FIG. 4 is a schematic diagram illustrating an equivalent circuit of a memory block of a 2D NAND memory array according to an embodiment. For example, the memory block comprises bit lines BL1, BL2, BL3, BL4 and word lines WL1, WL2, WL3, WL4. Memory cells of an array are defined at crisscross points between the bit lines BL1, BL2, BL3, BL4 and the word lines WL1, WL2, WL3, WL4. The memory block may also comprise a string selecting line (SSL), a ground selecting line GSL and a ground line GND. The word lines WL1, WL2, WL3 and WL4 are between the string selecting line SSL and the ground selecting line GSL.

In embodiments, each of the memory blocks (such as the main memory block MB and/or the extra memory block EB) may comprise the string selecting line SSL, the ground selecting line GSL and a word line WL (such as the word line WL1, the word line WL2, the word line WL3, the word line WL4) disposed between the string selecting line SSL and the ground selecting line GSL of its own (i.e. controlled independently). The word lines WL1, WL2, WL3 and WL4 are electrically connected to a word line decoder (WL decoder).

In an embodiment, each of the main memory block MB and the extra memory block EB may have an equivalent circuit similar to FIG. 4. For example, one portion of bit lines BL1, BL2, BL3 and BL4 is used for the main bit lines MBL, while the other portion of the bit lines BL1, BL2, BL3 and BL4 is used for the extra bit lines EBL. The bit lines BL1, BL2, BL3, BL4 are electrically connected to a page buffer.

In the present disclosure, the main bit line MBL may be also referred as to a non-extra bit line or a non-redundant bit line. In an embodiment, as a memory cell (string) fails due to an defect occurring on the corresponding main bit line MBL (or a memory channel which the main bit line MBL connects to), the extra bit line EBL can be used for redundancy repair or error checking and correcting (ECC) so as to maintain an expected effective memory capacity and improve efficiency for the memory device. In the present disclosure, the extra bit line EBL may be also referred as to an additional bit line or a redundant bit line. In the present disclosure, the main bit line MBL and the extra bit line EBL are not a dummy bit line. Generally, the dummy bit line is not for working a memory cell. The dummy bit line may be disposed in a non-practical peripheral region or may be used for decreasing a loading effect of a manufacturing process.

In the present disclosure, the main memory block MB may be also referred to as a non-extra memory block or a non-redundant memory block.

In an embodiment, as a NAND string fails due to a defect occurring to the corresponding main bit line MBL in the main memory block MB, the extra bit line EBL in the same main memory block MB can be used for redundancy repair or ECC.

In an embodiment, as the memory cells in the main memory block MB all fail for example due to a defect occurring to at least one of the word lines WL1, WL2, WL3, WL4, the extra memory block EB can be used for block repair. In the present disclosure, the extra memory block EB may be also referred as to an additional memory block or a redundant memory block.

In an embodiment, as a NAND string fails due to a defect occurring to the corresponding main bit line MBL in the extra memory block EB, the extra bit line EBL in the same extra memory block EB can be used for redundancy repair or ECC.

A ratio of the extra memory blocks EB to the main memory blocks MB (i.e. a value obtained by dividing a quantity Q of the extra memory blocks EB by a quantity P of the main memory blocks MB) means a block quantity ratio A. A ratio of the extra bit lines EBL to the main bit lines MBL (i.e. a value obtained by dividing a quantity K of the extra bit lines EBL by a quantity N of the main bit lines MBL) means a bit line quantity ratio B. In embodiments, the block quantity ratio A is larger than the bit line quantity ratio B. In an embodiment, for example, the bit line quantity ratio B is 0.5% to 10%. In an embodiment, for example, the block quantity ratio A is larger than 10%.

The concept of the present disclosure is not limited to the 2D NAND memory array, and may be applied for a 3D NAND memory array.

Figure 5:
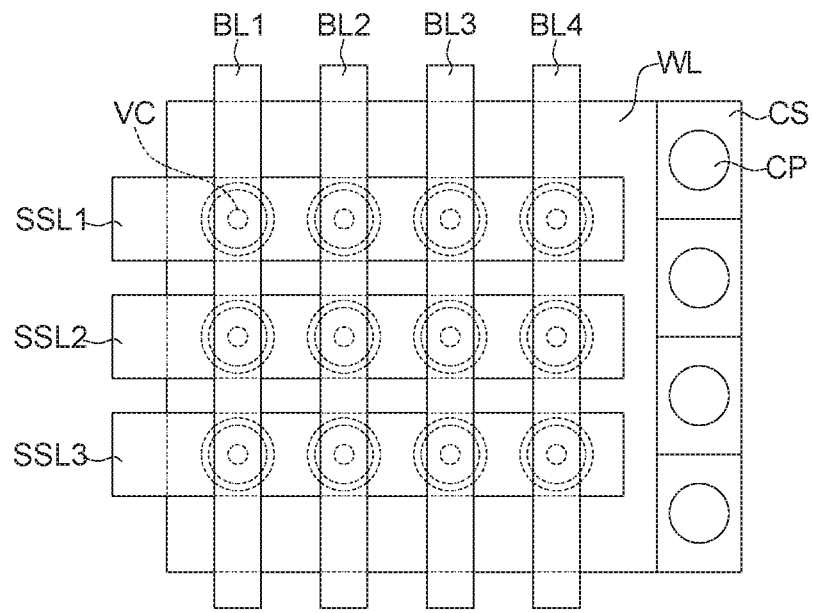
FIG. 5 illustrates a top view for a 30 vertical channel (CV) NAND memory device according to an embodiment.
Figure 6:
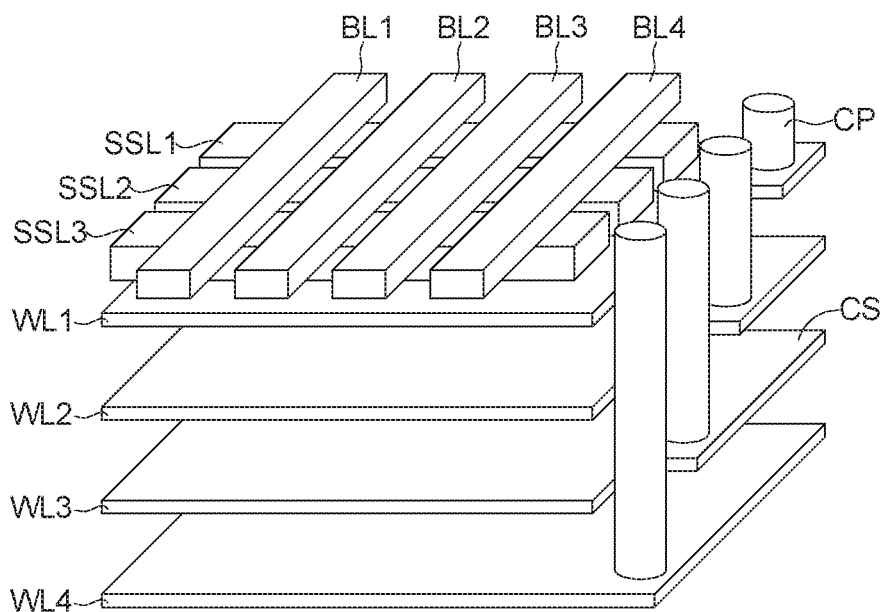
FIG. 6 illustrates a stereoscopic drawing for a 3D CV NAND memory device according to an embodiment.
Figure 7:
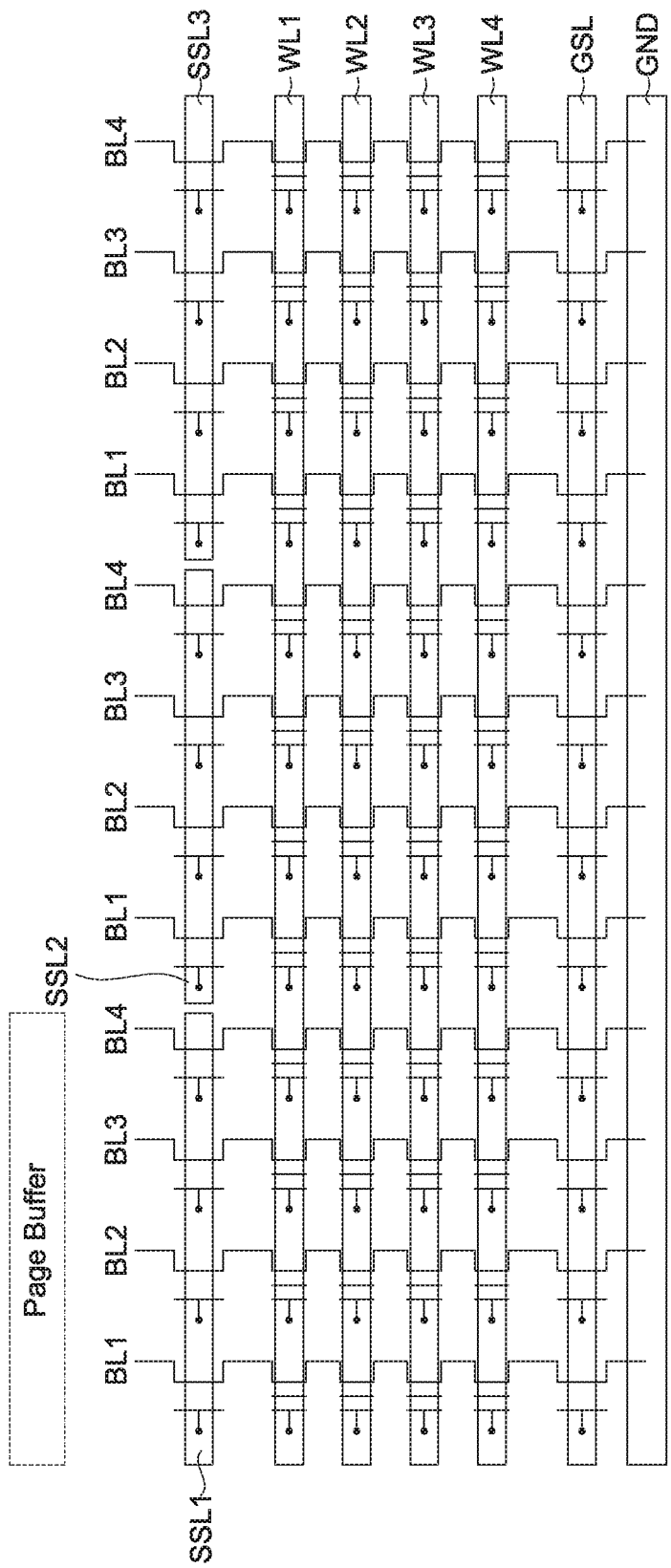
FIG. 7 shows an equivalent circuit of a memory block.

For example, refer to FIG. 5 to FIG. 7. FIG. 5 and FIG. 6 are illustrating a top view and a stereoscopic drawing for a 3D vertical channel (CV) NAND memory device according to an embodiment, respectively. FIG. 7 shows an equivalent circuit of a memory block.

Referring to FIG. 5 and FIG. 6, memory cells of an array are defined at crisscross points between vertical channels VC (not shown in FIG. 6) and the word lines WL (such as the word lines WL1, WL2, WL3, WL4). The vertical channels VC also pass through string selecting lines SSL1, SSL2 SSL3 to connect to the bit lines BL1, BL2, BL3, BL4. The word lines WL1, WL2, WL3, WL4 are electrically connected to contact plugs CP through stair contact CS. Referring to FIG. 7, the memory block may also comprise the ground selecting line GSL and the ground line GND. The word lines WL1, WL2, WL3, WL4 are disposed between the string selecting lines SSL1, SSL2, SSL3 and the ground selecting line GSL. The bit lines BL1, BL2, BL3, BL4 are electrically connected to the page buffer.

In embodiments, each of the memory blocks (such as the main memory block MB and/or the extra memory block EB) may comprise the string selecting line SSL (the string selecting line SSL1, the string selecting line SSL2, the string selecting line SSL3), the ground selecting line GSL and the word line WL (the word line WL1, the word line WL2, the word line WL3, the word line WL4) disposed between the string selecting line SSL and the ground selecting line GSL of its own (i.e. controlled independently). The word line WL is electrically connected to the word line decoder.

In an embodiment, as a NAND string fails due to a defect occurring to the main bit line MBL (such as a portion of the bit lines BL1, BL2, BL3 and BL4) in the main memory block MB, the extra bit line EBL (such as another portion of the bit lines BL1, BL2, BL3 and BL4) in the same main memory block MB can be used for redundancy repair or ECC so as to maintain an expected effective memory capacity and improve efficiency for the memory device.

In an embodiment, as the memory cells in the main memory block MB all fail for example due to a defect occurring to at least one of the word lines WL1, WL2, WL3, WL4, the extra memory block EB can be used for block repair. In an embodiment, as a NAND string fails due to a defect occurring to the corresponding main bit line MBL (such as a portion of the bit lines BL1, BL2, BL3 and BL4) in the extra memory block EB, the extra bit line EBL (such as another portion of the bit lines BL1, BL2, BL3 and BL4) in the same extra memory block EB can be used for redundancy repair or ECC so as to maintain an expected effective memory capacity and improve efficiency for the memory device.

In embodiments, the block quantity ratio A of the extra memory blocks EB to the main memory blocks MB is larger than the bit line quantity ratio B of the extra bit lines EBL to the main bit lines MBL. The condition of the block quantity ratio A being larger than the bit line quantity ratio B is meaningful for demands of improving product yield and efficiency for a memory device especially as there is a trend of increasing the quantity Q of the extra memory block EB for block repair for a 30 NAND memory device. In an embodiment, for example, the bit line quantity ratio B is 0.5% to 10%. In an embodiment, for example, the block quantity ratio A is larger than 10%.

The concept of the present disclosure is not limited to the 3D VC NAND memory device, and may be applied for a 3D vertical gate (VG) NAND memory array in other embodiments, for example.

In other embodiments, the memory block of the memory array may be further divided into sub memory blocks that could be controlled independently. Therefore, a repair unit can be defined as a smaller area. In addition, a repairing efficiency can be increased. The concept could be realized referring to embodiments illustrated with FIG. 8 and FIG. 9.

Figure 8:
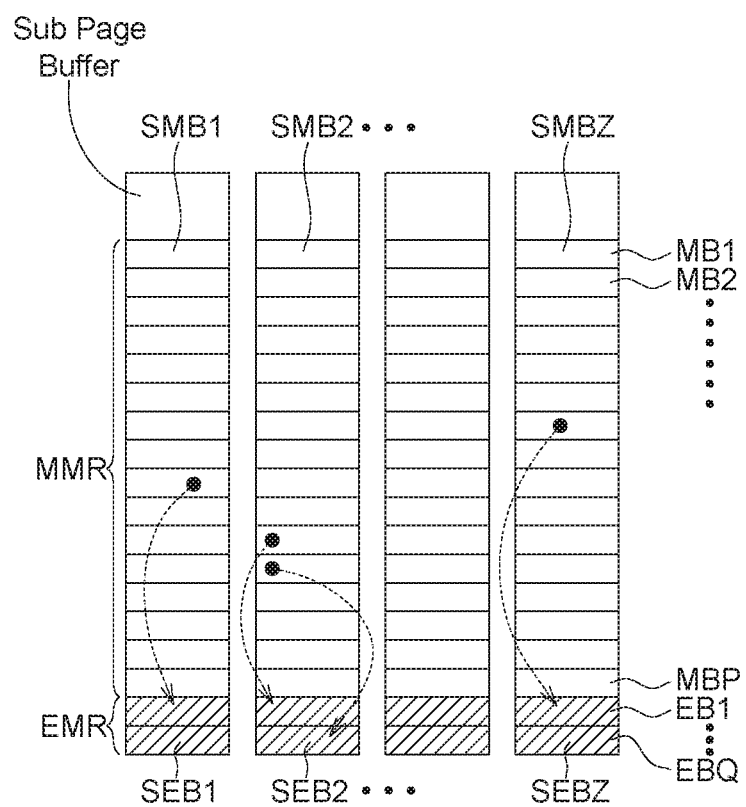
FIG. 8 is a schematic diagram illustrating a 3D NAND memory array according to another embodiment.

FIG. 8 is a schematic diagram illustrating a 3D NAND memory array according to another embodiment. In embodiments, each of the main memory block MB1, the main memory block MB2 to the main memory block MBP may comprise sub main memory blocks SMB1, SMB2 to SMBZ (Z is a positive integer) arranged along the extending direction of the word line WL. Each of the extra memory blocks EB1 to EBQ may comprise sub extra memory blocks SEB1, SEB2 to SEBZ (Z is a positive integer) arranged along the extending direction of the word line WL.

Figure 9:
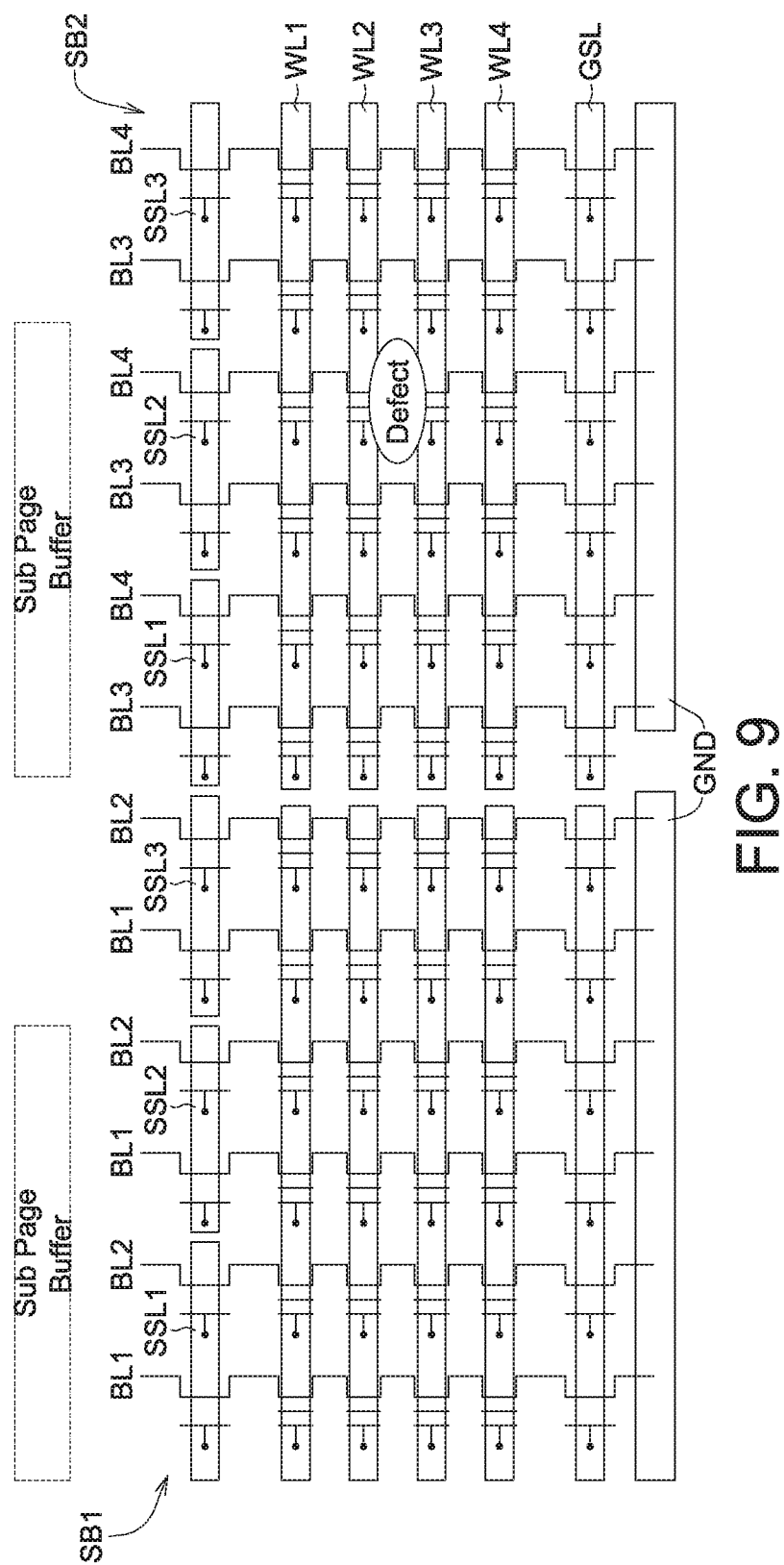
FIG. 9 is a schematic diagram illustrating an equivalent circuit of the memory block for the 3D NAND memory array according to an embodiment.

FIG. 9 is a schematic diagram illustrating an equivalent circuit of the memory block for the 3D NAND memory array according to an embodiment. For example, each of sub memory blocks SB (such as each of the sub memory block SB1 and the sub memory block SB2 as shown in FIG. 9) of the memory block may comprise the ground line GND, the ground selecting line GSL, the string selecting line SSL1, the string selecting line SSL2, the string selecting line SSL3 and the word lines WL1, WL2, WL3, WL4 between the ground selecting line GSL and the string selecting line SSL1, the string selecting line SSL2, the string selecting line SSL3 of its own (i.e. being controlled independently). The word lines WL1, WL2, WL3, WL4 in the sub memory block SB1 may be grouped as a word line group WLG1, while word lines WL1, WL2, WL3, WL4 in the sub memory block SB2 may be grouped as another word line group WLG2. In a top view of the memory array (with a concept similar to that shown in FIG. 2), the bit lines BL1, BL2, BL3, BL4 are arranged along the arrangement direction in sequence. In the embodiment, in the sub memory block SB1, memory cells of array are defined at crisscross points between the word lines WL1, WL2, WL3, WL4 and a bit line group SLG1 comprising the bit line BL1 and the bit line BL2, and the bit line group SLG1 is electrically connected to a sub page buffer. In the sub memory block SB2, memory cells of array are defined at crisscross points between the word lines WL1, WL2, WL3, WL4 and a bit line group SLG2 comprising the bit line BL3 and the bit line BL4, and the bit line group SLG2 is electrically connected to another sub page buffer.

In embodiments, the sub memory blocks are not limited to using the bit line group consisting of two of the bit lines. In other embodiments, the sub memory blocks may use other design kinds for the bit line group. For example, each of the bit line groups of the sub memory blocks may use three of the bit lines. Alternatively, the bit line groups of the sub memory blocks may use various quantities of the bit lines.

In an embodiment, the memory block shown in FIG. 9 may be the main memory block MB, in other words, the sub memory blocks SB1, SB2 may be the sub main memory blocks SMB. Alternatively, the memory block shown in FIG. 9 may be the extra memory block EB, in other words, the sub memory blocks SB1, SB2 may be the sub extra memory block SEB.

Referring to FIG. 9, for example, as the memory cells in the sub memory blocks SB2 all fail due to a defect occurring to at least one of the word lines WL1, WL2, WL3, WL4, the sub extra memory block SEB can be used for sub block repair. Referring to FIG. 8 as another example, as four of the sub main memory blocks SMB1, SMB2 to SMBZ fail due to a defect, four of the sub extra memory blocks SEB1, SEB2 to SEBZ can be used for sub block repair correspondingly.

Figure 10:
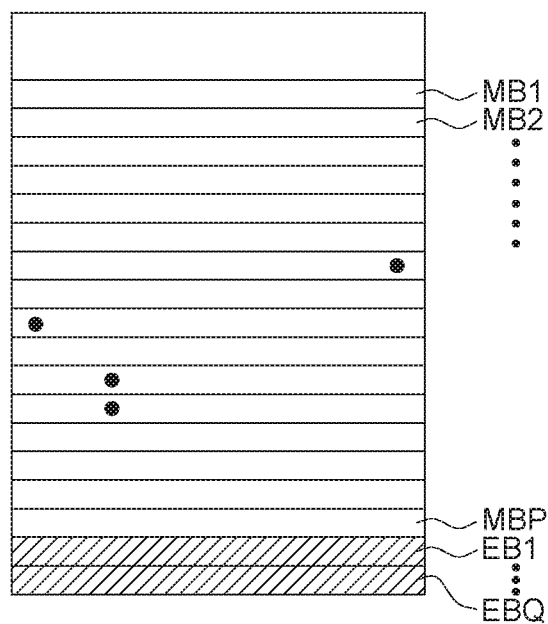
FIG. 10 is a schematic diagram illustrating a memory array according to an embodiment.
Figure 11:
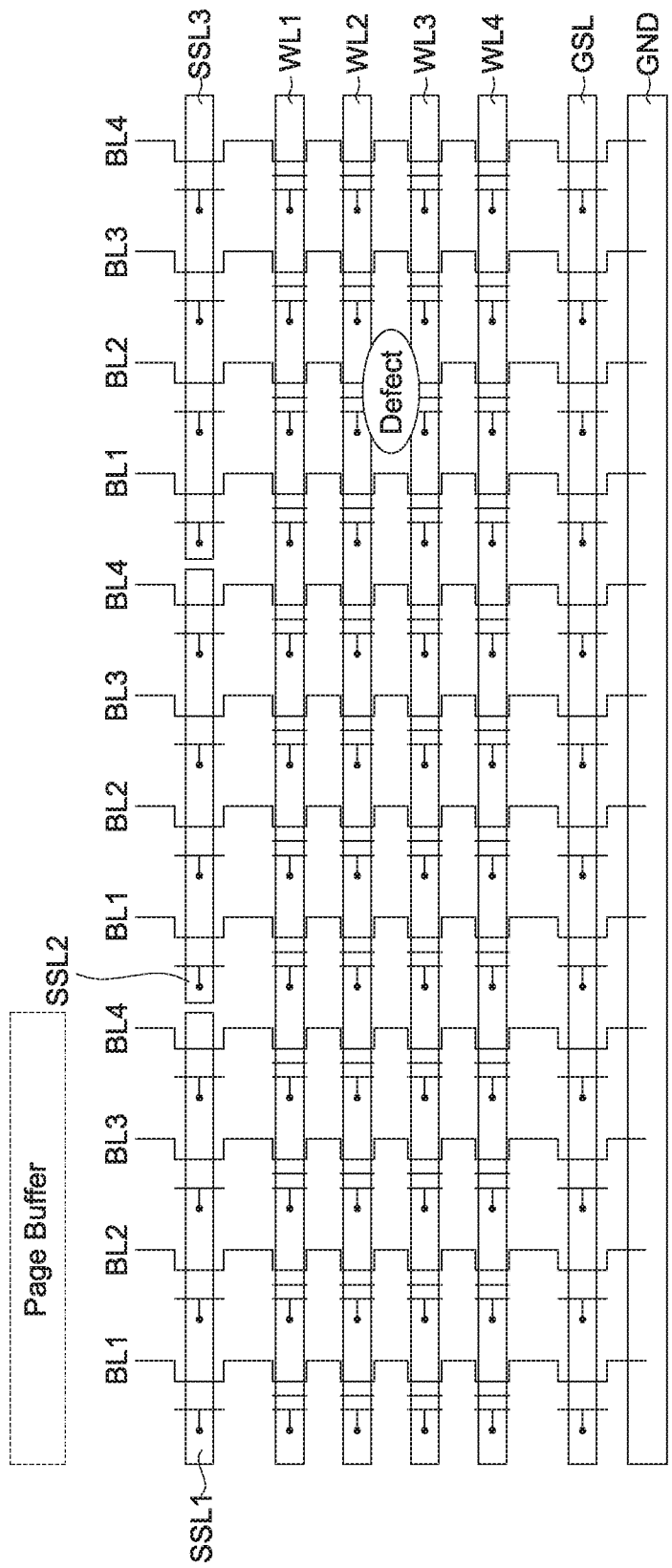
FIG. 11 is a schematic diagram illustrating an equivalent circuit of a memory block according to an embodiment.

In some embodiments, for example as shown in FIG. 10 and FIG. 11, the memory block is not divided into sub memory blocks, there may be an insufficient repair problem for the extra memory blocks EB as the defects of the same quantity occurs in the main memory blocks MB. In other words, compared to the memory device without the sub memory blocks as shown in FIG. 10, the memory device having the sub memory blocks as shown in FIG. 8 can be repaired with a smaller (area) repair unit to increase the repairing efficiency.

In embodiments, the bit lines BL in the sub memory blocks may comprise the main bit line MBL and the extra bit line EBL.

Figure 12:
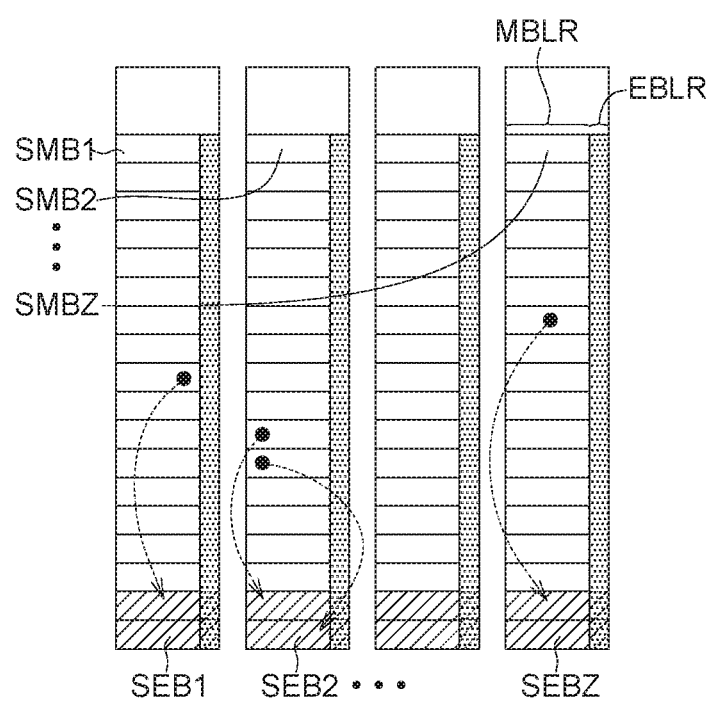
FIG. 12 is a schematic diagram illustrating a memory array according to another embodiment.

For example, FIG. 12 is a schematic diagram illustrating a memory array according to another embodiment, which is different from the memory array shown in FIG. 8 in that each of the sub memory blocks comprises the (main) bit line region MBLR and the (extra) bit line region EBLR.

In an embodiment, as a memory cell (string) fails due to an defect occurring on the corresponding main bit line MBL (or a memory channel which the main bit line MBL connects to) in the (main) bit line region MBLR, the extra bit line EBL in the (extra) bit line region EBLR can be used for redundancy repair or (ECC) so as to maintain an expected effective memory capacity and improve efficiency for the memory device.

In an embodiment, as a NAND string fails due to a defect occurring to the corresponding main bit line MBL in the sub main memory block SMB, the extra bit line EBL in the same sub main memory block SMB can be used for redundancy repair or ECC.

In an embodiment, as the memory cells in the sub main memory block SMB all fail for example due to a defect occurring to at least one of the word lines WL, the sub extra memory block SEB can be used for sub block repair.

In an embodiment, as a NAND string fails due to a defect occurring to the corresponding main bit line MBL in the sub extra memory block SEB, the extra bit lines EBL in the same sub extra memory block SEB can be used for redundancy repair or ECC.

In embodiments, a block quantity ratio of the sub extra memory blocks SEB to the sub main memory blocks SMB (i.e. a value obtained by dividing a quantity (Q*Z) of the sub extra memory blocks SEB by a quantity (P*Z) of the sub main memory blocks SMB) is equal to the block quantity ratio A. In embodiments, the block quantity ratio A is larger than the bit line quantity ratio B. In an embodiment, for example, the bit line quantity ratio B is 0.5% to 10%. In an embodiment, for example, the block quantity ratio A is larger than 10%.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising a memory array, wherein the memory array comprises a main memory block and an extra memory block, each of the main memory block and the extra memory block comprises bit lines and word lines electrically coupled to the bit lines, all of the word lines and the bit lines of the main memory block are independent from all of the word lines and the bit lines of the extra memory block, and the memory array comprises a main bit line and an extra bit line, wherein a ratio of a quantity of the extra memory block to a quantity of the main memory block is a block quantity ratio A, a ratio of a quantity of the extra bit line to a quantity of the main bit line is a bit line quantity ratio B, the block quantity ratio A is larger than the bit line quantity ratio B.

2. The memory device according to claim 1, wherein the bit line quantity ratio B is 0.5% to 10%.

3. The memory device according to claim 1, wherein the block quantity ratio A is larger than 10%.

4. The memory device according to claim 1, wherein each of the main memory block and the extra memory block comprises a portion of the main bit line and a portion of the extra bit line.

5. The memory device according to claim 1, wherein the extra bit line is used for redundancy repair or error checking and correcting (ECC) as damage occurs to the main bit line.

6. The memory device according to claim 1, wherein the extra bit line is used for redundancy repair or error checking and correcting as damage occurs to a memory cell corresponding to the main bit line.

7. The memory device according to claim 1, wherein the extra memory block is used for block repair as damage occurs to the main memory block.

8. The memory device according to claim 1, wherein the main memory block comprises sub main memory blocks, each of the sub main memory blocks comprises the word lines of the main memory block and a ground selecting line (GSL) controlled by their own sub main memory blocks independently.

9. The memory device according to claim 1, wherein the main memory block comprises sub main memory blocks, the bit lines of the main memory block are divided into bit line groups of at least two of the bit lines along an arrangement direction of the bit lines, the word lines of the main memory block are divided into word line groups corresponding to the bit line groups, each of the sub main memory blocks comprises one of the bit line groups and one of the word line groups, the word line groups of the sub main memory blocks are controlled independently.

10. The memory device according to claim 1, wherein the main memory block comprises sub main memory blocks, the main memory block further comprises ground selecting lines, the bit lines of the main memory block are divided into bit line groups of at least two of the bit lines along an arrangement direction of the bit lines, each of the sub main memory blocks comprises one of the ground selecting lines and one of the bit line groups, the ground selecting lines of the sub main memory blocks are controlled independently.

11. The memory device according to claim 1, wherein the extra memory block comprises sub extra memory blocks, each of the sub extra memory blocks comprises the word line of the extra memory block and a ground selecting line controlled by their own sub extra memory blocks independently.

12. The memory device according to claim 1, wherein the extra memory block comprises sub extra memory blocks, the bit lines of the extra memory block are divided into bit line groups of at least two of the bit lines along an arrangement direction of the bit lines, the word lines of the extra memory block are divided into word line groups corresponding to the bit line groups, each of the sub extra memory blocks comprises one of the bit line groups and one of the word line groups, the word line groups of the sub extra memory blocks are controlled independently.

13. The memory device according to claim 1, wherein the extra memory block comprises sub extra memory blocks, the extra memory block further comprises ground selecting lines, the bit lines of the extra memory block are divided into bit line groups of at least two of the bit lines along an arrangement direction of the bit lines, the word lines of the extra memory block are divided into word line groups corresponding to the bit line groups, each of the sub extra memory blocks comprises one of the ground selecting lines and one of the bit line groups, the ground selecting lines of the sub extra memory blocks are controlled independently.

14. The memory device according to claim 1, wherein the main memory block comprises sub main memory blocks, the extra memory block comprises sub extra memory block, a ratio of a quantity of the sub extra memory blocks to a quantity of the sub main memory blocks is a block quantity ratio equal to the block quantity ratio A.

15. The memory device according to claim 1, wherein the main memory block comprises sub main memory blocks, the extra memory block comprises sub extra memory block, each of the sub main memory blocks and the sub extra memory blocks comprises a portion of the main bit line and a portion of the extra bit line.

16. The memory device according to claim 1, wherein each of the main memory block and the extra memory block further comprises a string selecting line (SSL) and a GSL, wherein the word lines are between the SSL and the GSL.

17. The memory device according to claim 1, wherein the memory array comprises a NAND string.

18. The memory device according to claim 1, wherein the memory array comprises a 3D NAND memory array.

19. The memory device according to claim 1, wherein each of the main memory block and the extra memory block further comprises a ground selecting line, the ground selecting lines are controlled by their own main memory block and extra memory block independently.

20. The memory device according to claim 1, wherein the main memory block and the extra memory block have the same memory structure.

* * * * *